US006686920B1

(12) United States Patent
Peck, Jr. et al.

(10) Patent No.: US 6,686,920 B1
(45) Date of Patent: Feb. 3, 2004

(54) OPTIMIZING THE TRANSLATION OF VIRTUAL ADDRESSES INTO PHYSICAL ADDRESSES USING A PIPELINE IMPLEMENTATION FOR LEAST RECENTLY USED POINTER

(75) Inventors: John C. Peck, Jr., San Francisco, CA (US); Sridhar P. Subramanian, Sunnyvale, CA (US); Scott Waldron, Belmont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/568,388

(22) Filed: May 10, 2000

(51) Int. Cl.$^7$ ................................................ G09G 5/37
(52) U.S. Cl. ...................... 345/557; 711/133; 711/136; 711/140; 711/159; 711/160; 711/205; 711/207
(58) Field of Search ................................ 711/136, 207, 711/206, 100, 133, 3, 137, 140, 159, 160, 205; 712/216, 34; 365/233; 345/520, 557; 703/26

(56) References Cited

U.S. PATENT DOCUMENTS

| | | | | | |
|---|---|---|---|---|---|
| 4,682,281 | A | * | 7/1987 | Woffinden et al. | 711/207 |
| 5,802,568 | A | * | 9/1998 | Csoppenszky | 711/136 |
| 5,881,262 | A | * | 3/1999 | Abramson et al. | 712/216 |
| 5,905,509 | A | * | 5/1999 | Jones et al. | 345/520 |
| 6,259,650 | B1 | * | 7/2001 | Wen | 365/233 |

* cited by examiner

Primary Examiner—Matthew C. Bella
Assistant Examiner—Dalip K. Singh
(74) Attorney, Agent, or Firm—Farjami & Farjami LLP

(57) ABSTRACT

A system and method are provided for optimizing the translation of virtual addresses into physical addresses for a graphics address remapping table (GART). In the system and method, a translation look-aside buffer cache has a plurality of translation look-aside buffer entries. Each translation look-aside buffer entry is operable to buffer information which may be accessed for use in translating a virtual address into a physical address. A least recently used pointer circuit is operable to point to a translation look-aside buffer entry buffering information least recently used in the translation look-aside buffer cache. During operation, updates to the least recently used pointer circuit may be pipelined with corresponding accesses to the translation look-aside buffer cache.

15 Claims, 9 Drawing Sheets

OPTIMIZING THE TRANSLATION OF VIRTUAL ADDRESSES INTO PHYSICAL ADDRESSES USING A PIPELINE IMPLEMENTATION FOR LEAST RECENTLY USED POINTER

CROSS-REFERENCE TO RELATED PATENT APPLICATION

This application relates to the subject matter disclosed in U.S. patent application Ser. No. 09/477,216 filed on Jan. 4, 2000, entitled "Distributed Translation Look-Aside Buffers For Graphics Address Remapping Table," which is assigned to the present assignee and incorporated in its entirety herein by reference.

TECHNICAL FIELD OF THE INVENTION

The present invention relates generally to memory systems and, more particularly, optimizing the translation of virtual addresses into physical addresses using a pipeline implementation for least recently used pointer.

BACKGROUND OF THE INVENTION

Modern computer graphics applications require high-speed processing in order to generate realistic images on a display device (e.g., a computer monitor). Within a computer, the requisite processing power for modern graphics applications is provided by a host processor and a graphics controller. Large blocks of data and other information must travel to, from, and between the host processor and the graphics controller during operation.

With the Accelerated Graphics Port (AGP) architecture, data used by both the graphics controller and the host processor can be stored in system (host) memory. The AGP architecture provides a dedicated, high speed port through which data can be moved between the graphics controller and system memory. The AGP architecture utilizes host paging. As such, blocks of memory with contiguous linear addresses may not be physically contiguous in system memory. Specifically, each linear address corresponds to some location in a "virtual" memory. In the virtual memory, data for certain structures (e.g., texture maps) are stored in contiguous locations. In the physical system memory, however, the data may actually be stored in noncontiguous locations.

Because the host processor and the graphics controller must see data structures as contiguous blocks, the AGP architecture is equipped with core logic to translate the virtual linear addresses into corresponding physical addresses. This translation is accomplished with a memory-based Graphics Address Remapping Table (GART). The GART supports a mapping function between virtual addresses and physical addresses. With this mapping in the AGP architecture, a processing device (e.g., the host controller or the graphics controller) may use a translation look-aside buffer for performing memory accesses.

In general, the translation look-aside buffer functions to temporarily store data and information for performing translations. In an AGP architecture utilizing a memory-based GART, the translation look-aside buffer is initially searched for information which can be used for translation. If the desired information is not found within the translation look-aside buffer, a "miss" occurs and the information must be retrieved from main memory.

Various techniques have been previously developed in order to update or replace the data/information stored in a translation look-aside buffer. All of these previously developed techniques suffer from one or more problems. These problems include limited size (storage capacity) for the translation look-aside buffer, limited associativity of the memory in the translation look-aside buffer, and limited frequency of operation for updating or replacing the data/information stored in the translation look-aside buffer.

SUMMARY

The disadvantage and problems associated with previously developed techniques have been substantially reduced or eliminated with the present invention.

In accordance with one embodiment of the present invention, a system is provided for optimizing the translation of virtual addresses into physical addresses using a pipeline implementation. The system includes a main memory device operable to store information for translating a virtual address into a physical address. A translation look-aside buffer cache, coupled to the main memory, has a plurality of translation look-aside buffer entries. Each translation look-aside buffer entry is operable to buffer information for use in translating. A least recently used pointer circuit is coupled to the translation look-aside buffer cache. The least recently used pointer circuit is operable to point to a translation look-aside buffer entry buffering information least recently used in the translation look-aside buffer cache.

In accordance with another embodiment of the present invention, a method is provided for optimizing the translation of virtual addresses into physical addresses using a pipeline implementation. The method includes the following steps: buffering information for translating a virtual address into a physical address in a translation look-aside buffer cache having a number of translation look-aside buffer entries; and generating a least recently used pointer for pointing to the translation look-aside buffer entry having information least recently used in the translation look-aside buffer cache.

In accordance with yet another embodiment of the present invention, a translation look-aside buffer circuit is provided for optimizing the translation of virtual addresses into physical addresses using a pipeline implementation. The translation look-aside buffer circuit includes a translation look-aside buffer cache into which an access is made in a first clock cycle. The translation look-aside buffer cache comprises a plurality of translation look-aside buffer entries operable to buffer information for translating between a virtual address and a physical address. A least recently used pointer circuit, coupled to the translation look-aside buffer cache, is operable to point to a translation look-aside buffer entry buffering information least recently used for translation. The least recently used pointer circuit is operable to be updated in a second clock cycle to reflect the access into the translation look-aside buffer cache in the first clock cycle.

A technical advantage of the present invention includes providing a least recently used (LRU) scheme for replacing data/information in a translation look-aside buffer (TLB) of an Accelerated Graphics Port (AGP) architecture utilizing a Graphics Address Remapping Table (GART). Under this scheme, updates to an LRU pointer are pipelined with corresponding accesses to the translation look-aside buffer. That is, with pipelining, processing of any update to an LRU pointer occurs after processing of the corresponding access to the translation look-aside buffer. As such, each update to the LRU pointer may occur at least one clock cycle after the corresponding access to the translation look-aside buffer. By allowing each LRU pointer update to occur in a clock cycle following the one for the corresponding access to the translation look-aside buffer, timing objectives are more readily achieved. With the reduced timing demands, the present invention thus supports full associativity in the translation look-aside buffer. In addition, the present invention allows larger-sized (great capacity) translation look-aside buffers. Furthermore, the present invention enables higher frequency of operation for updating or replacing the data/information stored in the translation look-aside buffer. Accordingly, the present invention optimizes translation of virtual addresses into physical addresses for Graphics Address Remapping Table GART).

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

The preferred embodiments of the present invention and their advantages are best understood by referring to FIGS. 1–8 of the drawings. In the various drawings, like numerals are used for like and corresponding parts.

System With Centralized Translation Look-aside Buffer

Figure 1:
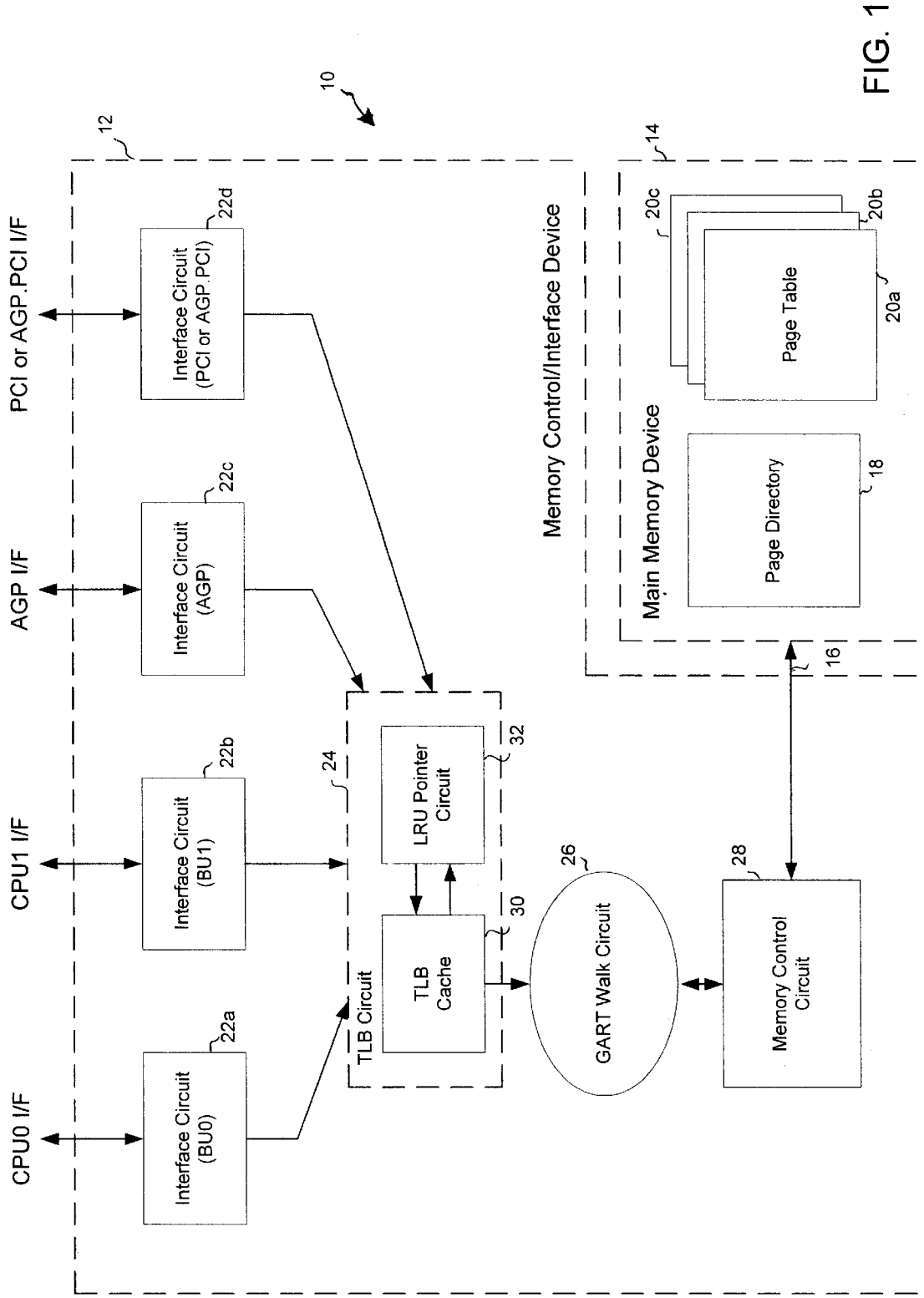
FIG. 1 is a block diagram for a Graphics Address Remapping Table (GART) system with a centralized translation look-aside buffer (TLB), according to an embodiment of the present invention.

FIG. 1 is a block diagram for a Graphics Address Remapping Table (GART) system 10 with a centralized translation look-aside buffer (TLB), according to an embodiment of the present invention. System 10 includes a memory control/interface device 12 and a main memory device 14.

Memory control/interface device 12 and main memory device 14 can each be an integrated circuit (IC) device separately packaged in suitable packaging (e.g., plastic, ceramic, micro-ball grid array (MBGA), or chip scale package (CSP)) with suitable leads or other connecting points (not shown) extending therefrom. Each of memory control/interface device 12 and main memory device 14 may comprise one or more semiconductor chips, wherein a "chip" is a separate piece of semiconductor material having an integrated circuit. Memory control/interface device 12 and main memory device 14 may be connected—for example, on a printed circuit board (PCB)—by a connection 16. As used herein, the terms "connected," "coupled," or any variant thereof, mean any connection or coupling, either direct or indirect between two or more elements; the connection or coupling can be logical or physical.

Main memory device 14 generally functions to store data and information which is routed through one or more buses (e.g., a peripheral component interface (PCI) bus or Accelerated Graphics Port (AGP) PCI bus) to and from various processing devices (e.g., a central processing unit (CPU), an AGP chipset, or a PCI controller). Main memory device 14 can be implemented as any suitable IC memory, and is typically a dynamic random access memory (DRAM).

As depicted, main memory device 14 is populated with a number of tables for storing information. These tables include a page directory 18 and one or more page tables 20, which are separately designated with reference numerals 20a, 20b, and 20c. Each page table 20 includes a number of page table entries. Each page table entry specifies a base address or frame address for a respective "page" of data in main memory device 14. Page directory 18 includes a number of page directory entries. Each page directory entry specifies the base address for one of the page tables 20. Page table entries and page table directory entries are explained below in more detail. In a two-level indexing scheme for GART, entries from page directory 18 and page tables 20 are used in translating between virtual addresses and physical addresses. In a one-level indexing scheme, only entries from the page tables 20 are used for the translation between virtual addresses and physical addresses.

Memory control/interface device 12 generally functions to control the access (storage and retrieval) of data and information to and from main memory device 14. Furthermore, memory control/interface device 12 functions as an interface between main memory device 14 and the one or more buses through which information or data is retrieved from or routed to main memory device 14. As depicted, memory control/interface device 12 includes a number of interface circuits 22, a translation look-aside buffer (TLB) circuit 24, a GART walk circuit 26, and a memory control circuit 28.

Interface circuits 22, which are separately designated with reference numerals 22a, 22b, 22c, and 22d, each function to support an interface between main memory device 14 and a specific processing device connected to memory control/interface device 12 by a respective bus. Each such bus allows the respective processing device to access main memory device 14 for the storage and retrieval of data and information. As depicted, interface circuit 22a may comprise a first bus unit (BU) which supports a first central processing unit (CPU0). Similarly, interface circuit 22b may comprise a second bus unit (BU) for supporting a second central processing unit (CPU1). Interface circuit 22c may comprise a unit for supporting an Accelerated Graphics Port (AGP) chipset. Interface circuit 22d may comprise a unit for supporting a peripheral component interface (PCI) controller or an AGP/PCI controller.

Translation look-aside buffer (TLB) circuit 24 is coupled to each of interface circuits 22a, 22b, 22c, and 22d. Because all of the interface circuits 22 share utilization of TLB circuit 24 (as described herein), TLB circuit 24 is considered to be "centralized." TLB circuit 24 functions to store (at least temporarily) information which is used for translating between virtual addresses and physical addresses. During operation, when a particular virtual address is to be translated, an interface circuit 22 accesses TLB circuit 24 for information (e.g., page table entries) to execute the translation. If such information is found in TLB circuit 24, there is a "hit" and the information is used to make the translation. On the other hand, if such information is not found in TLB circuit 24, there is a "miss" and the desired information must be retrieved from main memory device 14. For each "miss," a TLB circuit 24 will make a request to obtain the information necessary for performing the desired translation.

As depicted, TLB circuit 24 comprises a TLB cache 30 coupled to a least recently used (LRU) pointer circuit 32. TLB cache 30 includes a number of TLB entries, each of which stores information that can be used for translating between virtual addresses and physical addresses. For example, the information in any given TLB entry may specify a particular virtual address and the physical address to which the virtual address corresponds. In one embodiment, TLB cache 30 can be implemented as a sixteen-entry, fully-associative cache.

During operation, the information stored in any given TLB entry of TLB cache 30 may be changed, updated, or replaced with other information as needed for performing a particular translation. Thus, if there is a "miss," the information in one or more TLB entries may be overwritten with new information retrieved from main memory device 14. In updating cache memory, it is inefficient to rewrite any information which is used or accessed most often. Accordingly, when replacing the information in TLB cache 30, it is desirable to overwrite the information which is used least recently.

LRU pointer circuit 32 generally functions to generate a pointer to the TLB entry of TLB cache 30 which stores information least recently used for translation. The information in the TLB entry to which the LRU pointer points will be the next to be replaced when an update is made to TLB cache 30. As such, LRU pointer circuit 32 outputs a writer pointer (wr_ptr) signal specifying the next-to-be-replaced entry of TLB cache 30.

As described in more detail below, LRU pointer circuit 32 may include a number of pointer entries which store status information for the TLB entries of TLB cache 30. This status information indicates how recently the information within each TLB entry of TLB cache 30 was used. One pointer entry identifies which TLB entry stores information least recently used (LRU) for translation. Another pointer entry identifies which TLB entry stores information next least recently used. This continues for all other pointer entries of LRU pointer circuit 32, so that the final pointer entry identifies the TLB entry of TLB cache 30 storing information most recently used (MRU). Thus, the pointer entries of LRU pointer circuit 32 range from least recently used (LRU) to most recently used (MRU). In one embodiment, LRU pointer circuit 32 can be implemented with a number of flip-flops for storing sixteen pointer entries.

Like the information stored in TLB cache 30, the status information within LRU pointer circuit 32 may also be updated during operation—i.e., the information in any given pointer entry may be changed. The updates to LRU pointer circuit 32 are made to reflect the current status of usage for the information in the TLB entries of TLB cache 30. In one embodiment, updates to the pointer entries are pipelined with corresponding accesses (each of which may result in either a "hit" or a "miss") into the TLB entries of TLB cache 30. That is, with pipelining, processing of any update to an LRU pointer follows processing of the corresponding access to the translation look-aside buffer. Essentially, for any given step of processing, the access to the translation look-aside buffer is processed first, and the corresponding update to the LRU pointer is processed thereafter. This may occur for a series of processing steps set out in a figurative "pipeline." With pipelining, the updates to LRU pointer circuit 32 may occur at least one clock cycle after the respective accesses to TLB cache 30.

GART walk circuit 26 is coupled to and receives requests from TLB circuit 24. In response to each request, GART walk circuit 26 generally functions to coordinate the retrieval of information (e.g., entries) from page directory 18 and page tables 20 in main memory device 14. This process of retrieving information from page table 20 and page directory 18 constitutes the table walk process. GART walk circuit 26 may include one or more state machines which implement the arbitration and the table walk processes. GART walk circuit 26 may ultimately retrieve the base addresses for physical data pages from the table entries in memory. Data desired by a particular processing unit may be located within each such physical data page. In one embodiment, GART walk circuit 26 may comprise a page directory cache for storing page directory entries from page directory 18 when the two-level indexing scheme is used.

Memory control circuit 28 is coupled between GART walk circuit 26 and main memory device 14. Memory control circuit 28 generally functions to control the actual storage into and retrieval out of main memory device 14. In addition, memory control circuit 28 may cooperate with GART walk circuit 26 during a table walk process to retrieve page directory entries and page table entries from page directory 18 and page tables 20.

In operation for GART system 10, interface circuits 22 may receive linear addresses for data that are desired by the respective processing devices. The linear addresses correspond to locations in a virtual memory. This virtual memory is not the same as the physical memory of main memory device 14 where the desired data may actually be stored. Thus, in order to retrieve the data from main memory device 14, the virtual linear addresses must be translated into corresponding physical addresses.

Each interface circuit 22 operates independently to support the translation of linear addresses for its corresponding processing device. Whenever an interface circuit 22 receives a particular linear address, the interface circuit 22 searches TLB cache 30 of TLB circuit 24 for information (e.g., page table entries and physical addresses) to execute the translation.

If the desired information is contained within one or more TLB entries of TLB circuit 24 (i.e., there is a "hit"), TLB circuit 24 will retrieve the information from the relevant TLB entries and the information is then used for making the translation. Alternatively, if the desired information is not contained within any TLB entries of TLB circuit 24 (i.e., there is a "miss"), this information must be retrieved from main memory device 14 (via GART walk circuit 26 and memory control circuit 28) and written into one or more TLB entries of TLB cache 30.

LRU pointer circuit 32 keeps track of which TLB entry in TLB cache 30 should be overwritten first with new information. In particular, LRU pointer circuit 32 points to the TLB entry having that information which is least recently used for translation. If information must be retrieved from main memory device 14 to execute a translation, it is written into the TLB entry of TLB cache 30 specified by the LRU pointer entry of LRU pointer circuit 32.

For any given access into TLB circuit 24 by one of interface circuits 22, an update may be made to the pointer entries of LRU pointer circuit 32. The update changes the status information stored in LRU pointer circuit 32 to reflect the usage of the information currently contained in TLB cache 30.

Each update to LRU pointer circuit 32 is pipelined with the respective access into TLB circuit 24 so that the update occurs in a clock cycle subsequent to the one during which the access into TLB cache 30 occurs. This avoids a critical timing path for an update to LRU pointer circuit 32 in the same clock cycle as the corresponding access to TLB cache 30. As such, timing objectives are easier to achieve within GART system 10. Accordingly, the frequency at which updates are made to TLB cache 30 may be increased. In addition, TLB cache 30 is more readily implemented as a fully-associative memory. Furthermore, constraints to the size of TLB cache 30 are substantially reduced.

System With Distributed Translation Look-aside Buffers

Figure 2:
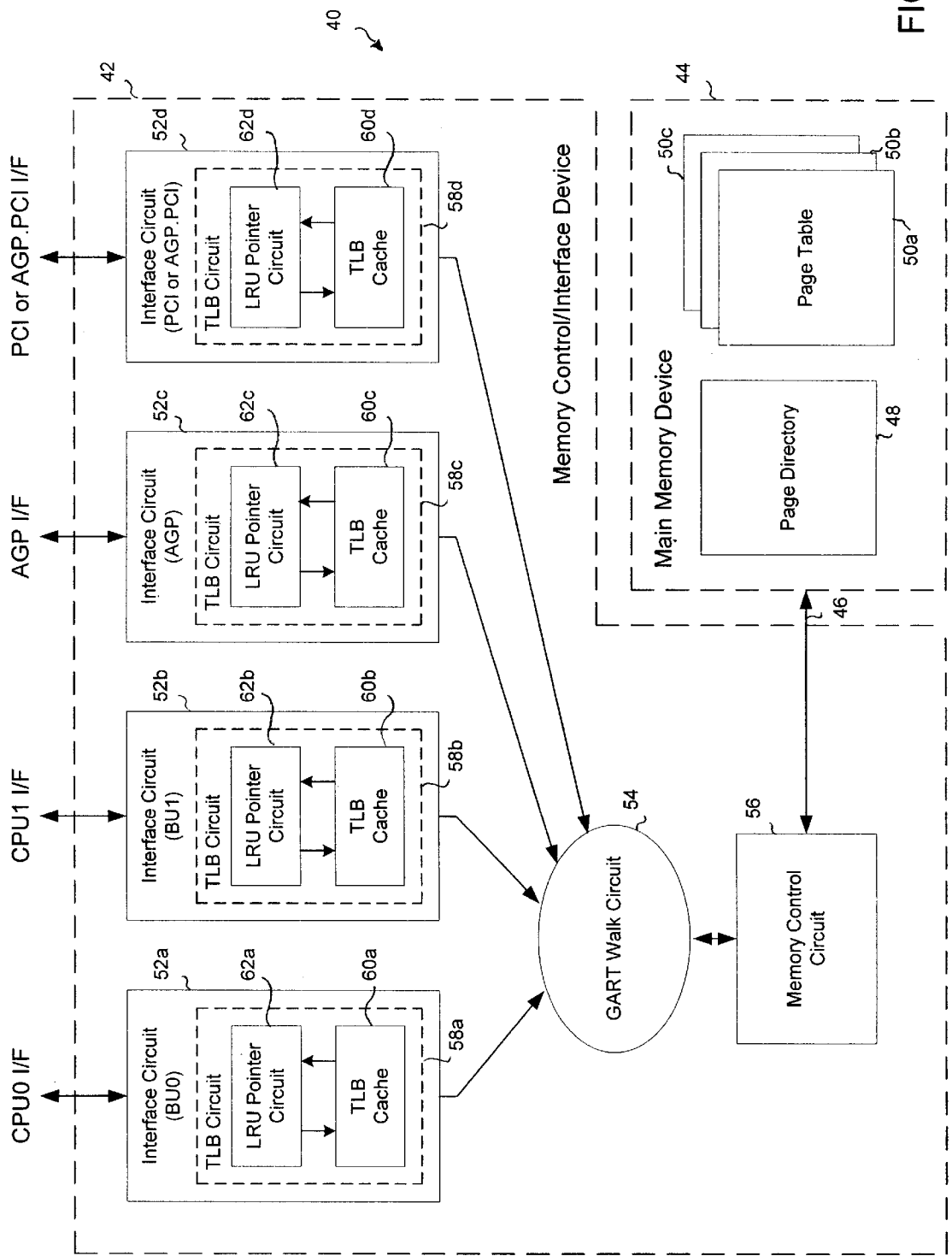
FIG. 2 is a block diagram for a GART system with distributed TLBs, according to an embodiment of the present invention.

FIG. 2 is a block diagram for a Graphics Address Remapping Table (GART) system 40 with distributed translation look-aside buffers (TLBs), according to an embodiment of the present invention. System 40 includes a memory control/interface device 42 and a main memory device 44.

Memory control/interface device 42 and main memory device 44 can each be an integrated circuit (IC) device separately packaged in suitable packaging with suitable leads or other connecting points (not shown) extending therefrom. Each of memory control/interface device 42 and main memory device 44 may comprise one or more semiconductor chips. Memory control/interface device 42 and main memory device 44 may be connected—for example, on a printed circuit board (PCB)—by a connection 46.

Main memory device 44 of system 40 can be substantially similar to main memory device 14 of system 10 depicted in FIG. 1. Main memory device 44 thus generally functions to store data and information which is routed through one or more buses to and from various processing devices (e.g., a central processing unit (CPU), an AGP chipset, or a PCI controller). Further, main memory device 44 is populated with a number of tables for storing information. These tables include a page directory 48 and one or more page tables 50, which are separately designated with reference numerals 50a, 50b, and 50c. Page directory 48 and page tables 50 are substantially similar to page directory 18 and page tables 20 depicted and described with reference to FIG. 1.

Memory control/interface device 42 of system 40 can be similar to memory control/interface device 12 of system 10 depicted in FIG. 1. As such, memory control/interface device 42 generally functions to control the access (storage and retrieval) of data and information to and from main memory device 44. In addition, memory control/interface device 42 functions as an interface between main memory device 44 and the one or more buses through which information or data is retrieved from or routed to main memory device 44. As depicted, memory control/interface device 42 includes a number of interface circuits 52, a GART walk circuit 54, and a memory control circuit 56.

Interface circuits 52, which are separately designated with reference numerals 52a, 52b, 52c, and 52d, each function to support an interface between main memory device 44 and a specific processing device connected to memory control/interface device 42 by a respective bus. As depicted, interface circuit 52a may comprise a first bus unit (BU) which supports a first central processing unit (CPU0). Similarly, interface circuit 52b may comprise a second bus unit (BU) for supporting a second central processing unit (CPU1). Interface circuit 52c may comprise a unit for supporting an Accelerated Graphics Port (AGP) chipset. Interface circuit 52d may comprise a unit for supporting a peripheral component interface (PCI) controller or an AGP/PCI controller.

A distinction between memory control/interface device 42 of FIG. 2 and memory control/interface device 12 of FIG. 1 is that each interface circuit 52 of device 42 comprises a separate translation look-aside buffer (TLB) circuit 58. In particular, interface circuits 52a, 52b, 52c, and 52d include TLB circuits 58a, 58b, 58c, and 58d, respectively. Because each interface circuit 52 has its own TLB circuit 58, TLB circuits 58 are considered to be "distributed."

As depicted, each TLB circuit 58 comprises a TLB cache 60 (separately labeled 60a, 60b, 60c, and 60d) coupled to a least recently used (LRU) pointer circuit 62 (separately labeled 62a, 62b, 62c, and 62d).

Each TLB cache 60 can be similar to TLB cache 30 depicted and described with reference to FIG. 1. Thus, each TLB cache 60 may include a number of TLB entries. Each such TLB entry stores information which can be used for translating between virtual addresses and physical addresses. During operation, the information stored in any given TLB entry of a TLB cache 60 may be updated or replaced with other information as needed for performing a particular translation. Thus, if there is a "miss," the information in one or more TLB entries may be overwritten with new information retrieved from main memory device 44. For each "miss," a TLB circuit 58 will make a request to obtain the information necessary for performing the desired translation.

In one embodiment, TLB caches 60a and 60b, contained within interface circuits 52a and 52b for respective central processing units, each can be implemented as an eight-entry, fully-associative cache. TLB cache 60c, contained within interface circuit 52c for the AGP chipset, can be implemented as a sixteen-entry, fully-associative cache. TLB cache 60d, contained within interface circuit 52d for the PCI or AGP/PCI controller, can be implemented as a four-entry, fully-associative cache.

Each LRU pointer circuit 62 can be substantially similar to LRU pointer circuit 32 depicted and described with reference to FIG. 1. Thus, each LRU pointer circuit 62 generally functions to generate a pointer to the TLB entry of the respective TLB cache 60 which stores information least recently used for translation. LRU pointer circuits 62 output respective write pointer (wr_ptr) signals specifying the next-to-be-replaced entries of the corresponding TLB caches 60. Each LRU pointer circuit 62 may include a number of pointer entries which store status information for the TLB entries of the respective TLB cache 60. This status information indicates how recently the information within each TLB entry of TLB cache 60 was used. The pointer entries of each LRU pointer circuit 62 may range from least recently used (LRU) to most recently used (MRU).

In one embodiment, each LRU pointer circuit 62 can be implemented with flip-flops for storing a plurality of pointer entries. The number of pointer entries in each LRU pointer circuit 62 may correspond to the number of TLB entries in the respective TLB cache 60. Thus, for example, if TLB caches 60a and 60b each have eight TLB entries, LRU pointer circuits 62a and 62b each include eight pointer entries. If TLB cache 60c has sixteen TLB entries, LRU pointer circuit 62c includes sixteen pointer entries. If TLB cache 60d has four TLB entries, then LRU pointer circuit 62d includes four pointer entries.

The status information within each LRU pointer circuit 62 may be updated during operation. The updates to each LRU pointer circuit 62 are made to reflect the current status of usage for the information in the TLB entries of the respective TLB cache 60. In one embodiment, updates to the pointer entries of each LRU pointer circuit 62 are pipelined with corresponding accesses into the respective TLB cache 60. With pipelining, the updates to each LRU pointer circuit 62 may occur one clock cycle after the respective accesses to a corresponding TLB cache 60.

GART walk circuit 54, which is coupled to each of interface circuits 52, receives requests from the various TLB circuits 58. GART walk circuit 54 arbitrates between the different requests. In response to each request, GART walk circuit 54 generally functions to perform the table walk process, whereby information is retrieved from page directory 48 and page tables 50 in main memory device 44. GART walk circuit 54 may include one or more state machines which implement the arbitration and the table walk processes. In one embodiment, GART walk circuit 54 may comprise a page directory cache for storing page directory entries from page directory 48 when the two-level indexing scheme is used.

Memory control circuit 56 is coupled between GART walk circuit 54 and main memory device 44. Memory control circuit 56 may be substantially similar to memory control circuit 26 shown and described with reference to FIG. 1. As such, memory control circuit 56 generally functions to control the actual storage into and retrieval out of main memory device 44. In addition, memory control circuit 56 may cooperate with GART walk circuit 54 during a table walk process to retrieve page directory entries and page table entries from page directory 48 and page tables 50.

The operation for GART system 40 shown in FIG. 2 is similar to the operation of GART system 10 shown in FIG. 1. A primary distinction in the operation of GART system 40 is that each interface circuit 52 searches its respective TLB circuit 58 for information to execute a translation, rather than searching in a centralized translation look-aside buffer. If desired information is not contained with a TLB circuit 58 (i.e., there is a "miss"), that TLB circuit 58 will issue a request to GART walk circuit 54 in order to obtain the desired information from main memory device 44. GART walk circuit 54 receives various requests from TLB circuits 58 and then arbitrates to determine an order for processing the requests. GART walk device 24 then performs the GART walk process for each request according to the determined order.

The GART walk process retrieves information from main memory device 44 and returns such information to the relevant TLB circuit 58. This information is written into one or more TLB entries of TLB cache 60. The respective LRU pointer circuit 62 keeps track of which TLB entry in TLB cache 60 should be overwritten first with new information. If information must be retrieved from main memory device 44 to execute a translation, it is written into the TLB entry of TLB cache 60 specified by the LRU pointer entry of LRU pointer circuit 62.

For any given access into a TLB circuit 58, an update may be made to the pointer entries of the respective LRU pointer circuit 62. The update changes the status information stored in LRU pointer circuit 62 to reflect the usage of the information currently contained in TLB cache 60.

Each update to an LRU pointer circuit 62 is pipelined with the respective access into the corresponding TLB cache 60 so that the update occurs in a clock cycle subsequent to the one during which the access into the TLB cache 60 occurs. This avoids a critical timing path for an update to the LRU pointer circuit 62 in the same clock cycle as the corresponding access to TLB cache 60. As such, timing objectives are easier to achieve within GART system 40. Accordingly, the frequency at which updates are made to each TLB cache 60 may be increased. In addition, each TLB cache 60 is more readily implemented as a fully-associative memory. Furthermore, constraints to the size of each TLB cache 60 are substantially reduced.

As already noted herein, many of the circuits and data structures depicted and described with reference to FIG. 2 are substantially similar to like-named circuits and data structures depicted and described with reference to FIG. 1. For clarity, the remainder of this description primarily uses the reference numerals for the circuits and data structures shown in FIG. 1, but it should be understood that in general the same description is equally applicable to the like-named circuits and data structures shown in FIG. 2.

Address Translation Structure

Figure 3:
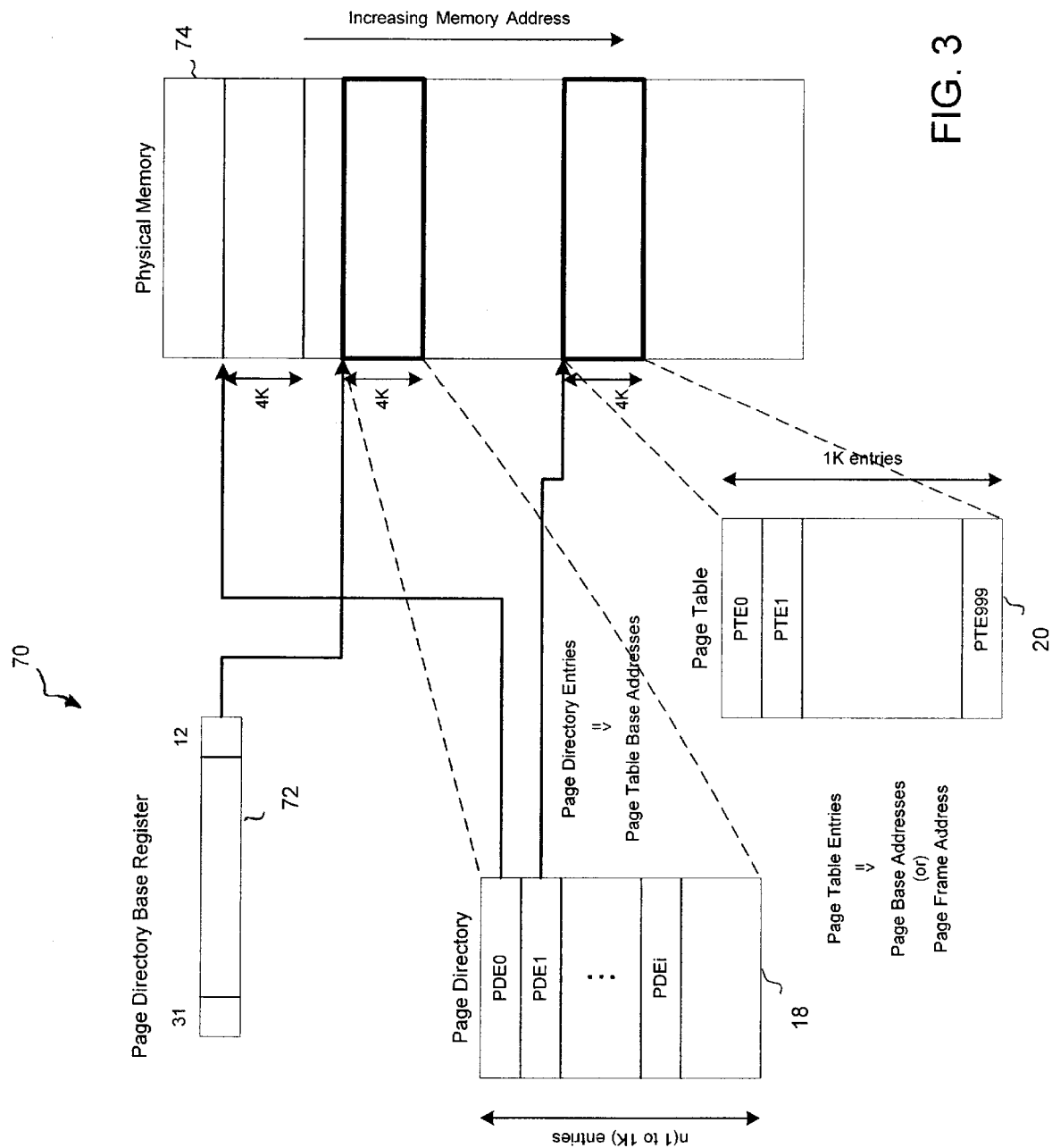
FIG. 3 illustrates a structure for translating virtual addresses into physical addresses in a GART system.

FIG. 3 illustrates a structure 70 for translating virtual addresses into physical addresses in GART system 10 (or 40). A virtual address may comprise 32 bits [31:0]. The first twelve bits [11:0] can correspond to a page offset, and the remaining twenty bits [31:12] can correspond to a virtual page address. In the table walk process, the 32-bit virtual address is used to access page directory entries and/or page table entries in order to derive a physical address, which may also comprise 32 bits [31:0]. In the physical address, the first twelve bits [11:0] are for a page offset and can be the same as the first twelve bits of the virtual address. The other bits of the physical address, [31:12], are for a physical page address.

Referring to FIG. 3, a virtual page address (i.e., bits [31:12] of the virtual address) can be stored in a page directory base register 72. The virtual page address points to the base address of a page directory 18 in a physical memory 74, which is an implementation of main memory device 14.

As shown, page directory 18 may comprise 4K of information. Page directory 18 includes a number of page directory entries (e.g., PDE0, PDE1, . . . , PDEi, etc.). In one embodiment, page directory 18 comprises n(1 to 1K) page directory entries, where n is equal to the number of page tables required to perform translation for a range of virtual addresses requested by a given application. Each page directory entry specifies a page table base address. That is, each page directory entry points to the base address for a particular page table 20.

Each page table 20 may include 4K of information. A page table 20 comprises a number of page table entries (e.g., PTE0, PTE1, . . . , and PTE999). As depicted, page table 20 comprises 1K entries. Each page table entry specifies a page base address. That is, each page table entry points to the base address for a particular page of information in physical memory 74. Alternatively, each page table entry may specify a page frame address, which defines the beginning and end of a page in physical memory 74.

Structure 70 depicted in FIG. 3 implements a two-level indexing scheme for translation between virtual addresses and physical addresses. Page directory 18 is utilized for the first level of indexing, and page table 20 is utilized for the second level of indexing. In an alternative embodiment, a one-level indexing scheme is implemented with a structure using only page tables for translation between virtual and physical addresses.

Two-level Indexing Scheme for GART Translation

Figure 4:
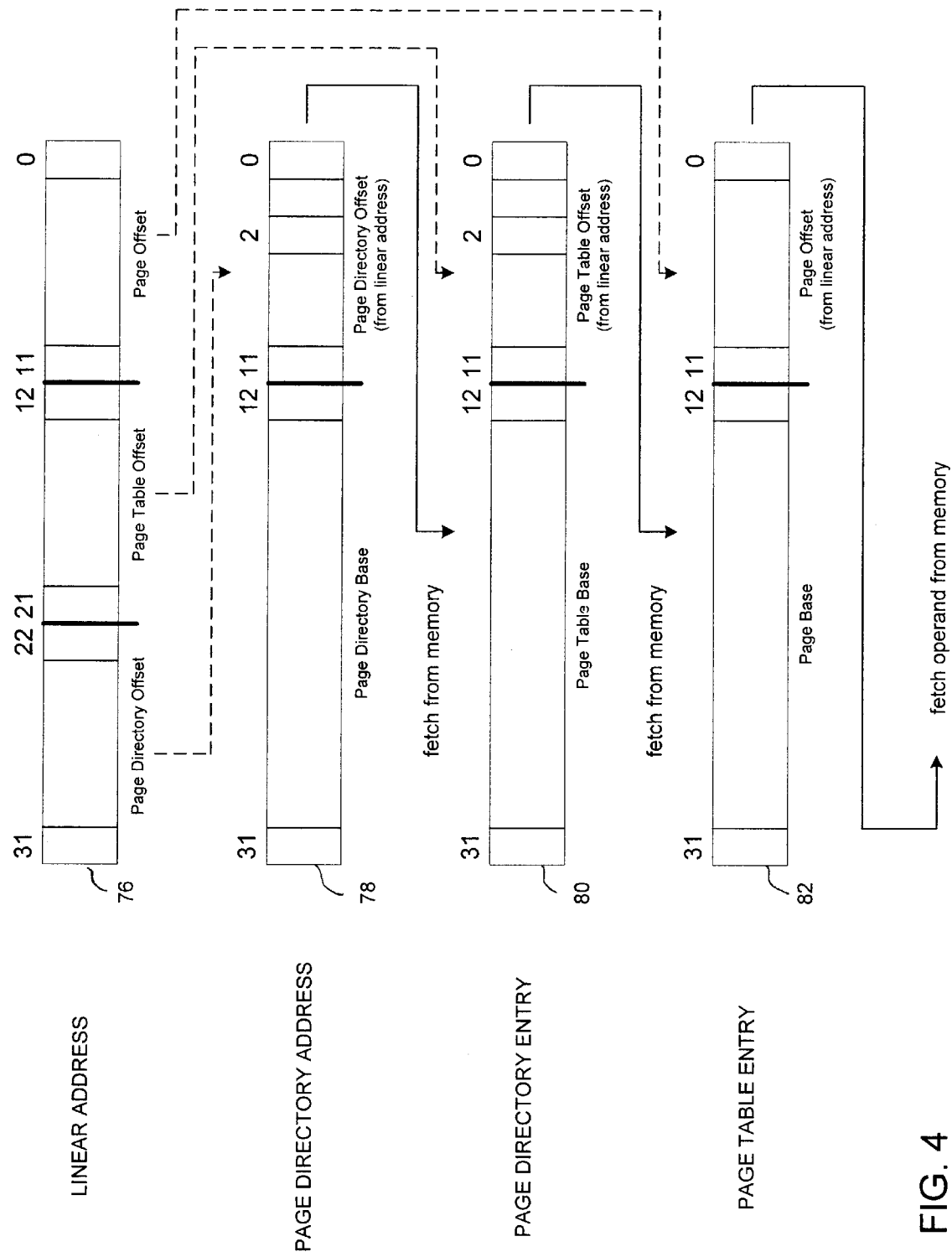
FIG. 4 illustrates a two-level indexing scheme for translation between a virtual address and a physical address in a GART system.

FIG. 4 illustrates a two-level indexing scheme for translation between a virtual address and a physical address in GART system 10. The physical address stores data which is desired for use as an operand by a particular processing device (e.g., a central processing unit, an AGP chipset, or a PCI controller). The virtual address comprises elements which allow the physical address to be accessed after two levels of indexing. The first level of indexing utilizes a page directory. The second level of indexing utilizes one or more page tables.

The virtual address can be a linear address 76 which comprises 32 bits [31:0]. The first twelve bits [11:0] are provided for a page offset. The page offset specifies an offset from the base address of a particular page, and thus points to a particular location in the page. At this location, the desired operand data is stored. The next ten bits [21:12] of linear address 76 are provided for a page table offset. The page table offset specifies an offset from the base address of a particular page table, and thus points to a specific location in such page table. This location contains information pointing to the page at which the desired operand data is stored. The last ten bits [31:22] of the linear address are provided for a page directory offset. The page directory offset specifies an offset from the base address of a page directory, and thus points to a specific location in such page directory. This location contains information pointing to the page table.

For indexing, a page directory address 78 comprises 32 bits [31:0]. The first twelve bits [11:0] of page directory address 78 may include the page directory offset from linear address 76. The remaining twenty bits [31:12] correspond to a page directory base. The page directory base is the base address in memory for the page directory. The page directory offset in the page directory address 78 specifies an offset from the base address of the page directory, and thus points to a particular location of the page directory. A fetch from memory at this location yields a page directory entry 80. Page directory entry 80 comprises 32 bits [31:0]. The first twelve bits [11:0] of page directory entry 80 may include the page table offset from linear address 76. The remaining twenty bits [31:12] correspond to a page table base, which is the base address for the page table. The page table offset in page directory entry 80 specifies an offset from the base address of the page table, and thus points to a particular location of the page table. A fetch from memory at this location yields a page table entry 82.

Page table entry 82 comprises 32 bits [31:0]. The first twelve bits [11:0] of page table entry 82 may include the page offset from linear address 76. The remaining bits [31:12] of page table entry 82 correspond to a page base. The page base is the base address in memory for the desired page. The page offset specifies an offset from the base address of the page, and thus points to a particular location of the page. A fetch from memory at this location yields the desired data operand.

Translation Look-aside Buffer Circuit

Figure 5:
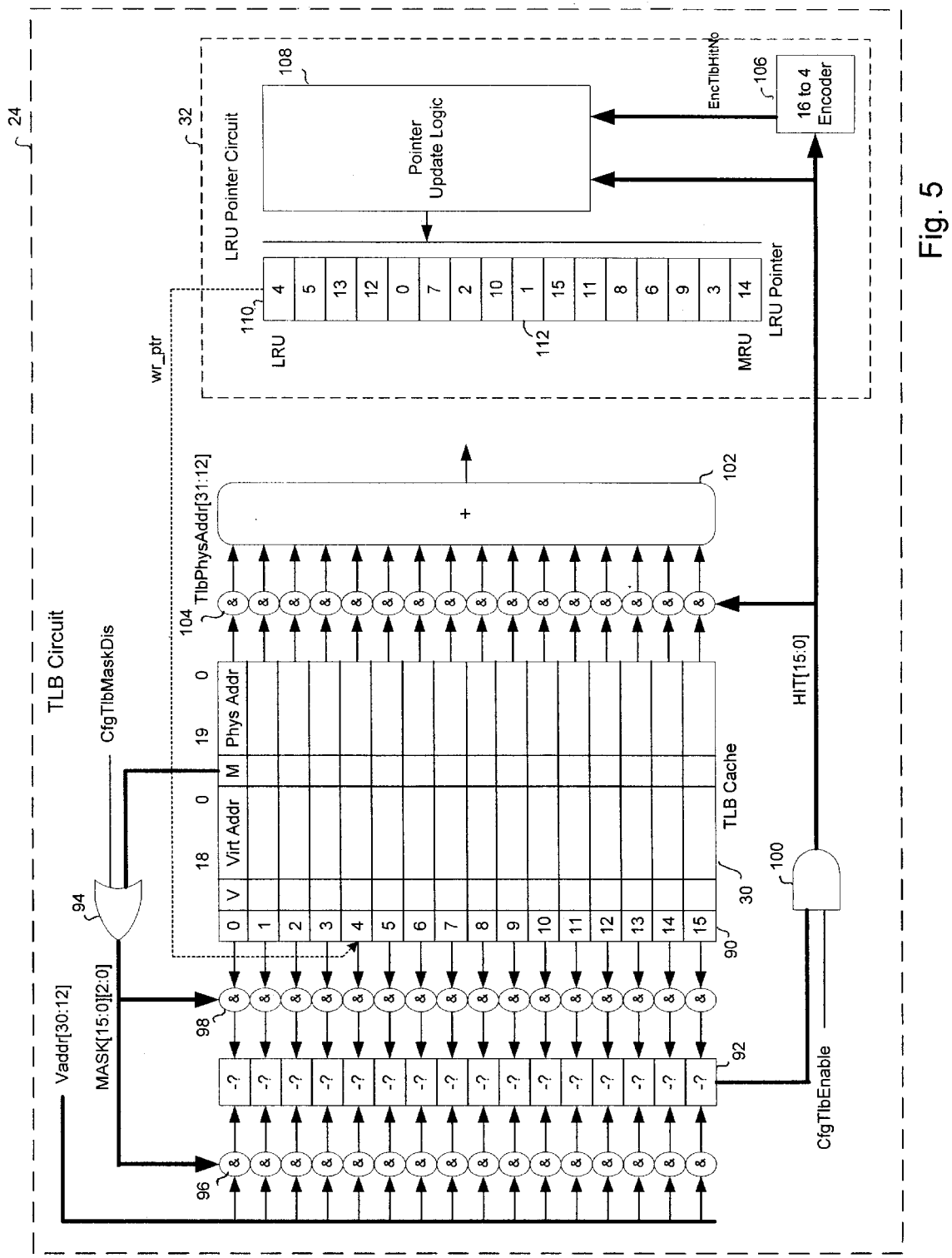
FIG. 5 is a block diagram for a translation look-aside buffer circuit, according to an embodiment of the present invention.

FIG. 5 is a block diagram for a translation look-aside buffer (TLB) circuit 24, according to an embodiment of the present invention. TLB circuit 24 is used in translating between virtual addresses and physical addresses, for example, in the context of a Graphics Address Remapping Table (GART) system 10. As depicted, TLB circuit 24 includes TLB cache 30 and LRU pointer circuit 32.

TLB cache 30 includes a number of TLB entries 90, only one of which is labeled with a reference numeral for clarity. Each TLB entry 90 stores information for translating a particular virtual address (Virt Addr) into a corresponding physical address (Phys Addr) of main memory device 14. As shown, each virtual address may be represented with nineteen bits [18:0] and each physical address may be represented with twenty bits [19:0]. Each TLB entry 90 may also store information for masking (M), as further described below.

A number of comparators 92 generally function to compare the virtual addresses (Virt Addr) stored within TLB entries 90 of TLB cache 30 against any given virtual address in the form of Vaddr[30:12]. Such virtual address Vaddr [30:12] may be received from an interface circuit 22 which desires to have the virtual address translated into a corresponding physical address. For clarity, only one comparator 92 is labeled with a reference numeral.

Each comparator 92 may compare virtual address Vaddr [30:12] against the virtual address (Virt Addr) stored in a particular TLB entry 90. With comparators 92, it can be determined whether the relevant virtual address Vaddr [30:12] is found within one of the TLB entries 90 of TLB cache 30. Thus, if virtual address Vaddr[30:12] matches the virtual address (Virt Addr) in a particular TLB entry 90 (i.e., there is a "hit"), the physical address (Phys Addr) of the same TLB entry 90 may be retrieved to complete a translation. If virtual address Vaddr[30:12] does not match any virtual address (Virt Addr) stored in TLB entries 90 (i.e., there is a "miss"), information must be retrieved from main memory device 14 and written into TLB cache 30 to perform the desired translation.

In one embodiment, an OR gate 94, coupled to TLB cache 30, receives the masking (M) information at one input node. At another input node, OR gate 94 receives a TLB mask (CfgTlbMaskDis) signal. The CfgTlbMaskDis signal generally supports a scheme for selectively masking at least some of the bits of virtual address Vaddr[30:12] before a comparison operation is performed, thereby allowing multiple pages to be referenced by a single TLB entry 90. In response to the mask information and the CfgTlbMaskDis signal, OR gate 94 outputs a mask signal which carries mask information in the form of MASK[15:0][2:0]. This mask information MASK[15:0][2:0] can be used to mask certain bits of the compare operations between TLB entries 90 of TLB cache 30 and virtual address Vaddr[30:12].

A first plurality of AND gates 96 and a second plurality of AND gates 98 are coupled to comparators 92. For clarity, only one AND gate 96 and only one AND gate 98 are labeled with reference numerals. Although not expressly shown, each AND gate 96 has two input nodes: a first input node receives the signal for mask information MASK[15:0][2:0], and a second input node receives the signal for virtual address Vaddr[14:12]. Similarly, each AND gate 98 has two input nodes: a first input node receives the signal for mask information MASK[15:0][2:0], and a second input node receives the virtual address (Virt Addr) stored in a respective TLB entry 90. AND gates 96 and 98 cooperate to support the selective masking of Vaddr[14:12]. This enables one TLB entry 90 to provide physical address information for up to eight virtual addresses.

An AND gate 100 is coupled to comparators 92. One input node of AND gate 100 receives a TLB enable (CfgTlbEnable) signal, which is used to enable the TLB circuit. This is provided to optionally generate TLB misses in order to study performance. At least another input node of AND gate 100 receives the output of comparators 92. AND gate 100 outputs a signal which carries hit information HIT[15:0]. Hit information HIT[15:0] comprises a plurality of bits, with a separate bit provided for each TLB entry 90. Hit information HIT[15:0] may generally indicate whether there is a "hit" or a "miss" as between a particular virtual address Vaddr[30:12] and each separate TLB entry 90 of TLB cache 30. Thus, for example, if the virtual address (Virt Addr) stored in the fourth TLB entry 90 matches virtual address Vaddr[30:12], then the fourth bit of hit information HIT[15:0] may have a "high" value and all other bits of hit information HIT[15:0] may have a "low" value.

A TLB physical address unit 102, which can be implemented as a multi-input OR gate, generally functions to output a physical address (Phys Addr) from a particular TLB entry 90 when the virtual address (Virt Addr) stored in that entry matches the virtual address Vaddr[30:12]. This completes the translation of a virtual address Vaddr[30:12] to a corresponding physical address.

A third plurality of AND gates 104 are connected to TLB cache 30 and AND gate 100. For clarity, only one AND gate 104 is labeled with a reference numeral. Although not expressly shown, each AND gate 104 has two input nodes: a first input node receives the signal for hit information HIT[15:0], and a second input node receives the physical address stored in a respective TLB entry's physical address portion. AND gates 104 may cooperate with multi-input OR gate 102 to support the selective output of a physical address (Phys Addr) from TLB cache 30. In particular, the hit information HIT[15:0] can be used to mask the output of all TLB entries 90 except for the one containing the virtual address (Virt Addr) which matches virtual address Vaddr [30:12]. Thus, only the physical address (Phys Addr) contained in this one TLB entry propagates through multi-input OR gate 102. Thus, AND gate 104 and OR gate 102 cooperate to function as a multiplexer. is output to TLB physical address unit 102.

LRU pointer circuit 32 functions to generate a pointer to the TLB entry 90 of TLB cache 30 which stores information least recently used for translation. The information in the TLB entry pointed to by LRU pointer circuit 32 will be the first to be replaced when new information is written into TLB cache 30. As shown, LRU pointer circuit 32 comprises an encoder 106, pointer update logic 108, and an LRU pointer 110.

Encoder 106 receives the signal for hit information HIT [15:0], which is output by AND gate 100. Encoder 106 generally functions to encode the hit information HIT[15:0], for example, from sixteen bits to four bits. Encoder 106 outputs an encoded TLB hit number (EncTlbHitNo) signal. If there is a "hit" for TLB cache 30, the encoded TLB hit number (EncTlbHitNo) signal specifies the TLB entry 90 containing a virtual address (Virt Addr) matching the virtual address Vaddr[30:12].

LRU pointer 110 comprises a number of pointer entries 112, only one of which is labeled for clarity. Each pointer entry 112 generally functions to store information for pointing to or specifying one of TLB entries 90 in TLB cache 30. Each pointer entry 112 may have a separate designation, which range from least recently used (LRU) to most recently used (MRU). Each designation corresponds to the usage of information stored in the respective TLB entry 90 specified by the pointer entry. For example, as shown in FIG. 5, the pointer entry 112 designated as LRU points to the TLB entry labeled "4." This indicates that at the present moment the information in the TLB entry labeled "4" has been least recently used for translation. Similarly, the pointer entry 112 designated as MRU points to the TLB entry labeled "14." This indicates that at the present moment the information in the TLB entry labeled "14" has been most recently used for translation. During the operation of TLB circuit 24, the TLB entry 90 to which any given pointer entry 112 points can change to reflect the current usage of the information stored in TLB cache 30.

LRU pointer circuit 32 outputs a write pointer (wr_ptr) signal. This write pointer signal generally functions to identify the TLB entry 90 into which new information should be written first. This TLB entry 90 is the same as the one specified in the pointer entry 112 which is designated LRU. Thus, for example, as shown in FIG. 5, because the pointer entry 112 designated as LRU points to the TLB entry labeled "4", the information in such TLB entry will be the first to be replaced when new information is written into TLB cache 30.

Pointer update logic 108 is coupled to encoder 106, LRU pointer 110, and AND gate 100. Pointer update logic 108 generally functions to update the pointer entries 112 of LRU pointer 110 in order to reflect the current usage of information in TLB cache 30. Pointer update logic 108 may also function to pipeline the updates into LRU pointer 104 after a corresponding access into TLB cache 30. Accordingly, each pointer update occurs at least in a clock cycle subsequent to the one during which the corresponding access into TLB cache 30 occurs.

Least Recently Used Pointer Circuit

Figure 6A:
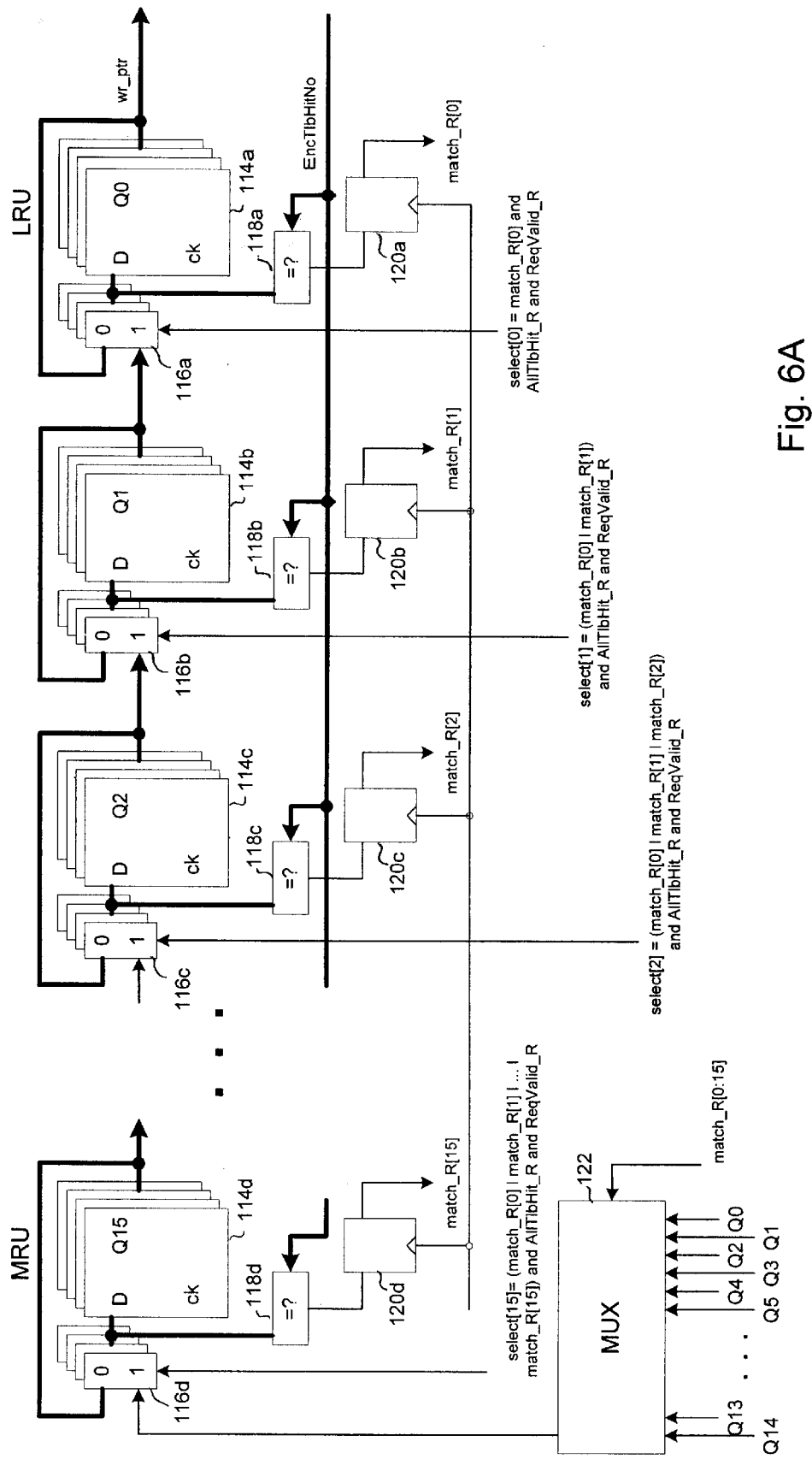
FIGS. 6A and 6B are schematic diagrams, in partial block form, for an implementation of an LRU pointer circuit, according to an embodiment of the present invention.
Figure 6B:
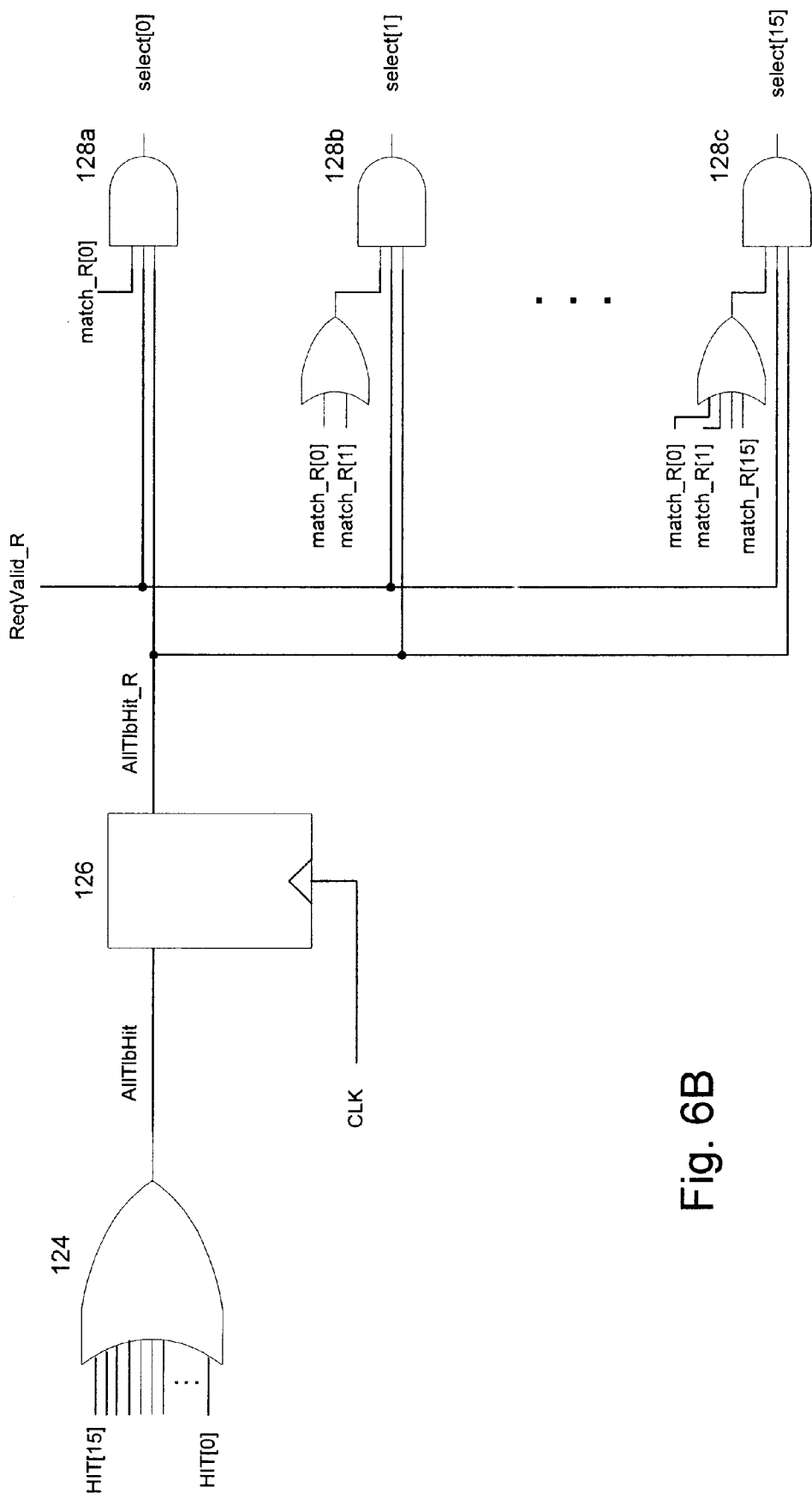

FIGS. 6A and 6B are schematic diagrams in partial block form for an implementation of LRU pointer circuit 32, according to an embodiment of the present invention.

Referring to FIG. 6A, this implementation of LRU pointer circuit 32 may include a number of flip flops 114, some of which are separately labeled 114a, 114b, 114c, and 114d. These flip flops 114 may be arranged in groups, with each group functioning to implement a separate pointer entry 112 of LRU pointer 110 (shown in FIG. 5). As depicted, flip flop 114a and three associated flip flops form a first group which implement the pointer entry designated least recently used (LRU). Likewise, flip flop 114b and three associated flip flops form a second group which implement the pointer entry designated next least recently used. This continues in like manner with flip flop 114d and three associated flip flops forming a final group in LRU pointer circuit 32 which implement the pointer entry designated most recently used (MRU).

For the implementation of LRU pointer circuit 32 depicted in FIG. 6A, the output of the first group of flip flops 114 is collectively referred to as "Q0." The output of the second group of flip flops 114 is collectively referred to as "Q1." This continues in like manner, with the output of the last group of flip flops 114 collectively referred to as "Q15." Q0 points to or specifies the TLB entry 90 containing information least recently used for translation. Q15 points to or specifies the TLB entry 90 containing information most recently used for translation.

A plurality of multiplexers 116 are connected to each group of flip flops 114, with a separate multiplexer 116 provided for each flip flop 114. A number of these multiplexers are separately labeled as 116a, 116b, 116c, and 116d. The output node of each multiplexer 116 is coupled to the input node of the respective flip flop 114, and one input node of each multiplexer 116 is coupled to the output node of the respective flip flop 114. Another input node of each multiplexer 116 (with the exception of the group of multiplexers 116d), receives the output of immediately preceding group of flip flops 114. Each group of multiplexers 116 is enabled with a respective select (Select[i]) signal. The select (Select [i]) signals are described below in more detail.

The groups of flip flops 114 and associated multiplexers 116 are connected in cascade. The group for the pointer entry designated MRU is first in the series, and the group for the pointer entry designated LRU is last in the series. With this arrangement, flip flops 114 and multiplexers 116 can be used to emulate a software linked list for recording the usage history of the TLB entries 90 of TLB cache 30. The last group of flip flops 114 and multiplexers 116 outputs the write pointer (wr_ptr) signal.

A number of comparators 118 are coupled to the groups of flip flops 114 and associated multiplexers 116. These comparators are separately labeled 118a, 118b, 118c, and 118d. Each comparator 118 receives the outputs of the respective multiplexers 116. In addition, each comparator 118 receives the encoded TLB hit number (EncTlbHitNo) signal, which is output from encoder 106 (FIG. 5). Comparators 118 function to compare the information contained in encoded TLB hit number (EncTlbHitNo) signal against the combined output of the respective multiplexers 116. If the TLB entry 90 specified by the encoded TLB hit number (EncTlbHitNo) signal is the same as the TLB entry specified by the output of multiplexers 116, there is a "match." This indicates that the information in such TLB entry 90 will be the most recently used for translating between a virtual address and a physical address.

A separate flip flop 120 is connected to each comparator 118. As shown, these flip flops 120 are separately labeled 120a, 120b, 120c, and 120d. Each flip flop 120 is timed with a clock (CLK) signal and receives the output of the respective comparator 118 at its input node. Each flip flop 120 outputs a match (match_R[i]) signal, which is essentially a registered version of the signal output by the respective comparator 118.

A multiplexer 122 has an "enable" input at which it receives the combined output of flip flops 120—i.e., match_ R[0:15]. In addition, multiplexer 122 receives the outputs of the various groups of flip flops 114 implementing TLB entries—i.e., Q0, Q1, Q2, . . . , and Q15. Multiplexer 122 multiplexes Q0–Q15 to output a signal which is then input into the multiplexers 116d of the first group of flip flops 114d (implementing the pointer entry designated MRU).

Now referring to FIG. 6B, an implementation for LRU pointer circuit 32 further includes an OR gate 124. OR gate 124 receives the hit information HIT[15:0] (FIG. 5) at its inputs. OR gate 124 outputs an all TLB hit (AllTlbHit) signal, which generally indicates whether any TLB entry 90 of TLB cache 30 contains relevant information for performing a desired translation. In one embodiment, if there is a "hit" for TLB cache 30, one of the bits of hit information HIT[15:0] will have a "high" value, thus causing OR gate 124 to output a "high" value for the all TLB hit (AllTlbHit) signal. Alternatively, if there is a "miss" for TLB cache 30, none of the bits of hit information HIT[15:0] will have a "high" value, thus causing OR gate 124 to output a "low" value for the all TLB hit (AllTlbHit) signal.

A flip flop 126 is coupled to the output of OR gate 124, thus receiving the all TLB hit (AllTlbHit) signal. Flip flop 126 also receives the clock (CLK) signal. Flip flop 126 generally functions to store a current value of the all TLB hit (AllTlbHit) signal for a clock cycle.

A number of AND gates 128—separately labeled 128a, 128b, and 128c—are coupled to flip flop 126. A separate AND gate 128 may be provided for each pointer entry 112 of LRU pointer 110. Each AND gate receives the all TLB hit (AllTlbHit) signal at one of its inputs and a request valid registered (ReqValid_R) signal at another of its inputs. The request valid registered (ReqValid_R) signal generally indicates a registered version of the ReqValid signal. In addition, each AND gate 128 receives, at yet another input, one or a combination of match (match R[i]) signals (FIG. 6A). As shown, AND gate 128a receives the match_R[0] signal. Likewise, AND gate 128b receives a combination of the match_R[0] and match_R[1] signals. This continues in like manner for every other AND gate 128, with AND gate 128c receiving a combination of the match_R[0], match_R[1], . . . , and match_R[15] signals.

AND gates 128 each output a respective select (Select[i]) signal. As depicted, AND gate 128a outputs the select[0] signal; AND gate 128b outputs the select[1] signal; and so forth, with AND gate 128c outputting the select[15] signal.

From the above description, the logic for any given select signal is as follows:

Select[i]=(match_R[15] or match_R[14] or . . . match_ R[0]) and AllTlbHit_R and ReqValid_R Accordingly, in one embodiment, assuming that there is a "hit" for TLB cache 30 and a valid request for a translation exists, a particular select (Select[i]) signal will be high if there is a match of the value stored in the corresponding pointer entry 110, or any pointer entry 110 "downstream" of that corresponding entry, with the TLB entry 90 containing information which was a "hit."

Thus, for example, the select[0] signal will be high if Q0 specifies the TLB entry 90 for which there is a "hit." The select[1] signal will be high if Q0 or Q1 specifies the TLB entry 90 for which there is a "hit." Similarly, the select[2] signal will be high if any of Q0, Q1, or Q2 specifies the TLB entry 90 for which there is a "hit." This pattern continues for each select (Select[i]) signal up to and including select signal[15], which will be high if any of Q0, Q1, Q2, . . . , or Q15 specifies the TLB entry 90 for which there is a "hit." The select (Select[i]) signals are input into respective multiplexers 116 (FIG. 6A) for implementing pointer entries.

With respect to the implementation of LRU circuit 32 shown in FIGS. 6A and 6B, any portion or all of comparators 118, flip flops 120, multiplexers 122, OR gate 124, flip flop 126, and AND gates 128 may serve to implement pointer update logic 108 (FIG. 5).

In operation, at reset the initial values of the groups of flip flops 114 for the pointer entries are as follows: Q0=0; Q1=1; Q2–2; . . . ; and Q15=15. These values output by flip flops 114 are input into the corresponding multiplexers 116.

For each access to TLB cache 30, multiplexers 116 multiplex Q0, Q1, Q2, . . . , and Q15 with Q1, Q2, Q3, . . . , and the output of multiplexer 122, respectively. Each multiplex operation is enabled by way of a corresponding select (Select[i]) signal. Each select (Select[i]) signal generally indicates whether there is "hit" at the TLB entry specified by the respective pointer entry (Qi) or any "downstream" pointer entry (Qi-1, Qi-2, . . . , or Q0)

The output of the multiplexers 116 are compared in parallel against encoded TLB hit number (EncTlbHitNo) signal at comparators 118. If there is "hit" for TLB cache 30, then the output of one of multiplexers 116 will match the TLB hit number (EncTlbHitNo) signal. In such case, the values stored in the respective group of flip flops 114 (for the matching multiplexers 116) is shifted via multiplexer 122 into the first group of flip flops 114 in the cascade—i.e., the group implementing the pointer entry designated most recently used (MRU). The values stored in each group of flip flops 114 which are "upstream" of the matching group are shifted into the respective next group. In other words, if there is a "hit" for Q(n), then the information of Q(n) is shifted into Q(15), and the information of Q(n+1), Q(n+2), . . . Q(15) is shifted forward into Q(n), Q(n+1), . . . Q(14), respectively.

Alternatively, if there is "miss" for TLB cache 30, then none of the outputs of any group of multiplexers 116 will match the TLB hit number (EncTlbHitNo) signal. In this case, the values stored in the last group of flip flops 114 in the cascade (i.e., the group implementing the pointer entry designated least recently used (LRU)) is shifted via multiplexer 122 into the first group of flip flops 114 in the cascade (i.e., the group implementing the pointer entry designated most recently used (MRU)). The values stored in each group of flip flops 114 which are "upstream" of the last group in the cascade are shifted into the respective next group. In other words, if there is a "miss," then the information of Q(0) is shifted into Q(15), and the information of Q(1), Q(2), . . . Q(15) is shifted forward into Q(0), Q(1), . . . Q(14), respectively.

Accordingly, the pointer entries implemented by flip flops 114 are updated to reflect usage of the information in the TLB entries of TLB cache 30.

For each access to TLB cache 30, flip flops 120 and 126 cooperate to pipeline a corresponding update to LRU pointer 104 so that the update occurs at least one clock cycle after the particular access to TLB cache 30.

Timing Diagram

Figure 7:
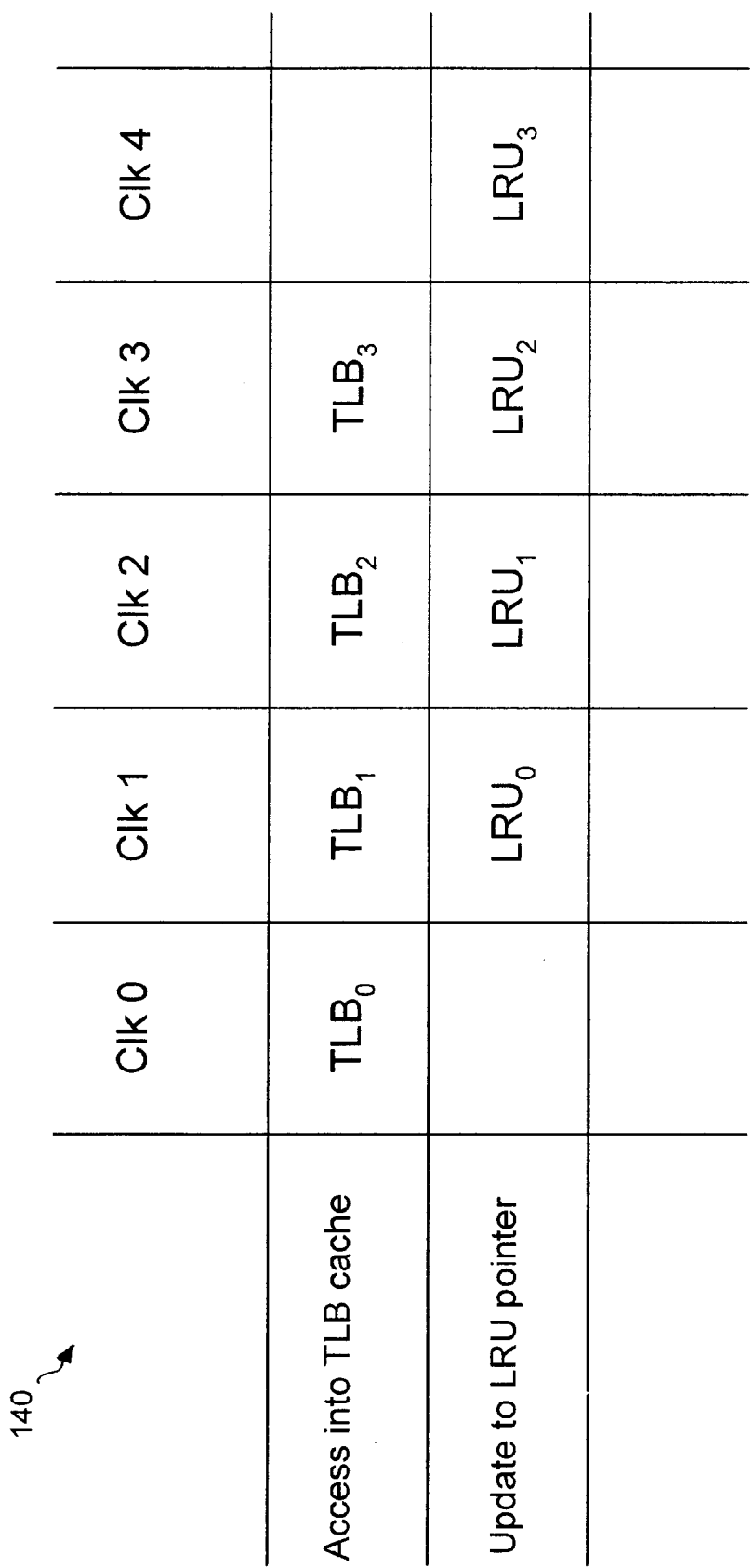
FIG. 7 is a timing diagram illustrating the pipelining of updates to an LRU pointer with corresponding updates to a TLB, according to an embodiment of the present invention.

FIG. 7 is a timing diagram 140 illustrating the pipelining of updates to an LRU pointer circuit 32 with corresponding accesses to a TLB cache 30, according to an embodiment of the present invention.

FIG. 7 shows a number of TLB cache accesses, which are separately labeled $TLB_0$, $TLB_1$, $TLB_2$, $TLB_3$. These TLB cache accesses are performed over a number of respective clock cycles, which are separately labeled Clk 0, Clk 1, Clk 2, and Clk 3. A number of updates to LRU pointer 110—which are separately labeled $LRU_0$, $LRU_1$, $LRU_2$, $LRU_3$—correspond to the accesses into TLB cache. In particular, $LRU_0$, $LRU_1$, $LRU_2$, $LRU_3$ correspond to $TLB_0$, $TLB_1$, $TLB_2$, $TLB_3$, respectively.

The updates to LRU pointer 110 are performed over a number of respective clock cycles—i.e., Clk 1, Clk 2, Clk 3, and Clk 4. Thus, as shown, each LRU pointer update occurs one clock signal after the corresponding access into TLB cache.

Method for Optimizing Translation

Figure 8:
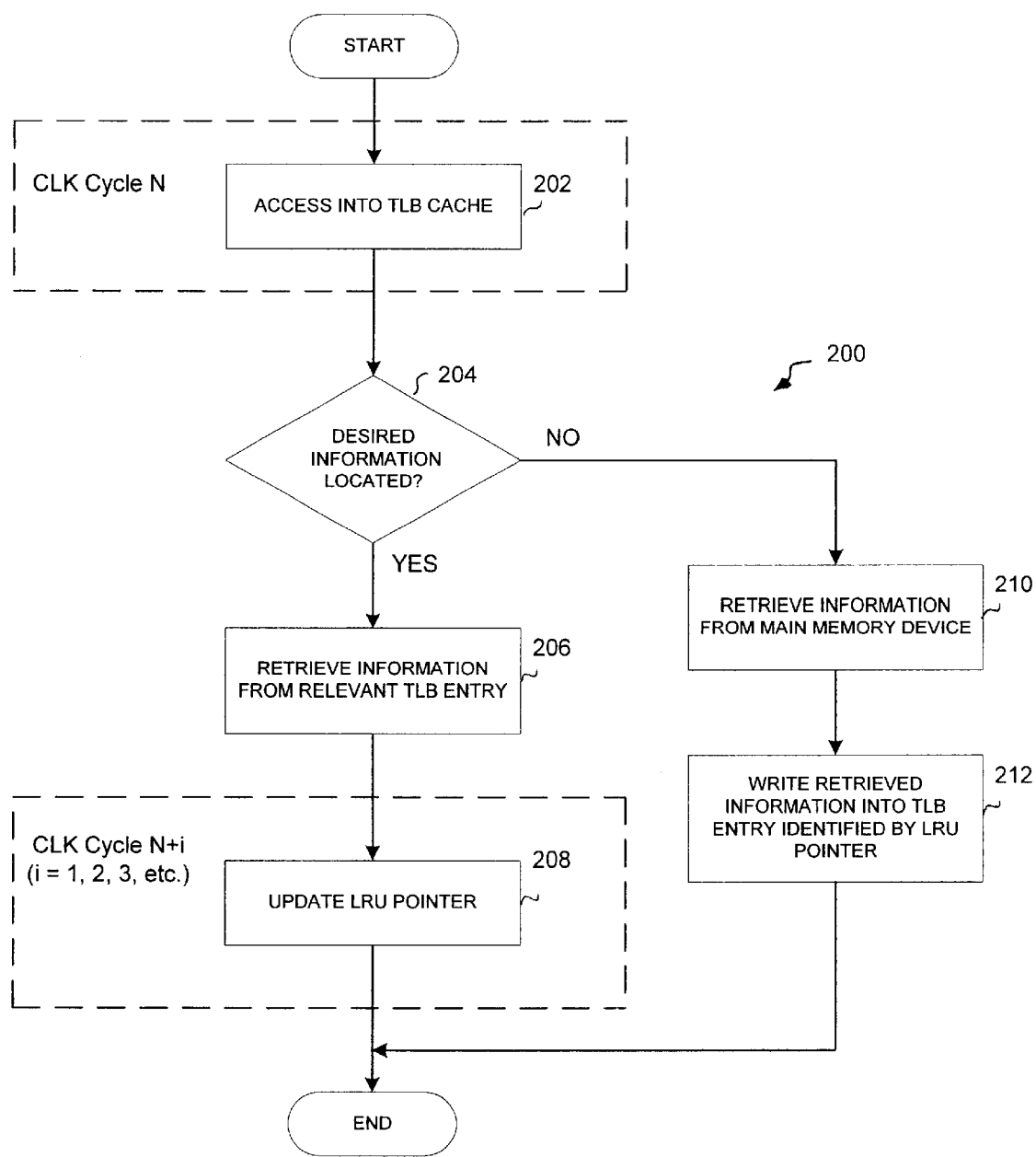
FIG. 8 is a flow diagram of a method for optimizing the translation of a virtual address into a physical address for a GART system, according to an embodiment of the present invention.

FIG. 8 is a flow diagram of a method 200 for optimizing the translation of a virtual address into a physical address for a Graphics Address Remapping Table (GART), according to an embodiment of the present invention. Method 200 may correspond to the operation of TLB circuit 24.

Method 200 begins at step 202 where an access is made into TLB cache 30 in order to perform a translation of a virtual address Vaddr[30:12] into a physical address for accessing data from physical memory.

At step 204, it is determined whether the desired information for making the translation is located within any TLB entry 90 of TLB cache 30. This may be accomplished using comparators 92. In particular, each comparator 92 compares the received virtual address Vaddr[30:12] against the virtual address (Virt Addr) stored in the respective TLB entry 90 of TLB cache 30.

Thus, if the virtual address (Virt Addr) of a particular TLB entry matches the received virtual address Vaddr[30:12] (i.e., the desired information is located within TLB cache 30), then the physical address (Phys Addr) contained within that TLB entry is retrieved at step 206 and used for translation. At step 208, an update is made to LRU pointer 110. This update reflects the usage of the information from the relevant TLB entry 90. Afterwards, method 200 ends.

Alternatively, if no virtual address (Virt Addr) of any TLB entry matches the received virtual address Vaddr[30:12] (i.e., the desired information is not located within TLB cache 30), then at step 210 the desired information is retrieved from main memory device 14. At step 212, the retrieved information is written into TLB cache 30 at the TLB entry 90 specified by the pointer entry 112 designated as least recently used (LRU). This newly written information is then used to translate virtual address Vaddr[30:12] into a corresponding physical address. At step 208, an update is made to LRU pointer 110 to reflect the usage of the information in TLB cache 30. Afterwards, method 200 ends.

It can be seen in FIG. 8 that each update to the LRU pointer 110 occurs in a clock cycle subsequent to the corresponding access to TLB cache 30.

Although the present invention and its advantages have been described in detail, it should be understood that various changes, substitutions, and alterations can be made therein without departing from the spirit and scope of the invention as defined by the appended claims.

What is claimed is:

1. A system for optimizing the translation of virtual addresses into physical addresses using a pipeline implementation, the system comprising:

a main memory device operable to store information for translating a virtual address into a physical address;

a translation look-aside buffer cache coupled to the main memory, the translation look-aside buffer cache comprising a plurality of translation look-aside buffer entries, each translation look-aside buffer entry operable to buffer information for use in translating; and a least recently used pointer circuit coupled to the translation look-aside buffer cache, the least recently used pointer circuit operable to generate and store a least recently used pointer, said least recently used pointer configured to point to a translation look-aside buffer entry buffering information least recently used in the translation look-aside buffer cache, said least recently used pointer comprising a plurality of pointer entries, each of said plurality of pointer entries operable to store status information for said plurality of translation look-aside buffer entries of said look-aside buffer cache, said plurality of pointer entries operable to be updated after an access into said translation look-aside buffer cache to reflect said access into said translation look-aside buffer cache.

2. The system of claim 1 wherein each pointer entry is operable to store status information for a separate translation look-aside buffer entry.

3. The system of claim 1 wherein the least recently used pointer circuit comprises:

pointer update logic coupled to the least recently used pointer, the pointer update logic operable to update the pointer entries, wherein each pointer entry is operable to store information for pointing to one of the translation look-aside buffer entries.

4. The system of claim 3 wherein:

the translation look-aside buffer cache is operable to be accessed in a first clock cycle for the information for use in translating; and the pointer update logic is operable to update a pointer entry in a second clock cycle in response to the access of the translation look-aside buffer cache, the second clock cycle subsequent to the first clock cycle.

5. The system of claim 1 wherein an update is made to the least recently least used pointer circuit to reflect the access into the translation look-aside buffer cache, and wherein the update to the least recently used pointer circuit is pipelined with the access into the translation look-aside buffer cache.

6. The system of claim 1 comprising a graphics address remapping table (GART) walk circuit coupled to the main memory device, the translation look-aside buffer cache, and the least recently used pointer circuit, the GART walk circuit operable to retrieve information from the main memory device and to write the retrieved information into the translation look-aside buffer entry pointed to by the least recently used pointer.

7. The system of claim 1 wherein the main memory device contains a page directory and a page table comprising the information used in translating a virtual address into a physical address.

8. A method for optimizing the translation of virtual addresses into physical addresses using a pipeline implementation, the method comprising:

buffering information for translating a virtual address into a physical address in a translation look-aside buffer cache having a plurality of translation look-aside buffer entries;

generating and storing a least recently used pointer for pointing to the translation look-aside buffer entry having information least recently used in the translation look-aside buffer cache, said least recently used pointer comprising a plurality of pointer entries, each of said plurality of pointer entries operable to store status information for said plurality of translation look-aside buffer entries; and updating said plurality of pointer entries after an access into said translation look-aside buffer cache to reflect said access into said translation look-aside buffer cache.

9. The method of claim 8 comprising:

determining whether the information presently buffered in translation look-aside buffer cache can be used for a given translation; and writing new information into the translation look-aside buffer entry pointed to by the least recently used pointer if information presently buffered in translation look-aside buffer cache cannot be used for the given translation.

10. The method of claim 9 further comprising updating the least recently used pointer after the new information is written.

11. A translation look-aside buffer circuit for optimizing the translation of virtual addresses into physical addresses using a pipeline implementation, the circuit comprising:

a translation look-aside buffer cache into which an access is made in a first clock cycle, the translation look-aside buffer cache comprising a plurality of translation look-aside buffer entries operable to buffer information for translating between a virtual address and a physical address; and a least recently used pointer circuit coupled to the translation look-aside buffer cache, the least recently used pointer circuit operable to generate and store a least recently used pointer, said least recently used pointer configured to point to a translation look-aside buffer entry buffering information least recently used for translation, the least recently used pointer circuit operable to be updated in a second clock cycle to reflect the access into the translation look-aside buffer cache in the first clock cycle, said least recently used pointer comprising a plurality of pointer entries, each of said plurality of pointer entries operable to store status information for said plurality of translation look-aside buffer entries of said look-aside buffer cache, said plurality of pointer entries operable to be updated in said second clock cycle to reflect said access into said translation look-aside buffer cache.

12. The translation look-aside buffer circuit of claim 11 wherein:

each of said plurality of pointer entries is operable to store information for pointing to one of the translation look-aside buffer entries, said least recently used pointer circuit comprising;

pointer update logic coupled to the least recently used pointer, the pointer update logic operable to update the said plurality of pointer entries.

13. The translation look-aside buffer circuit of claim 12 wherein each pointer entry is implemented with a plurality of flip flops.

14. The translation look-aside buffer circuit of claim 12 wherein the pointer entries each have a separate designation, the designations ranging from least recently used to most recently used.

15. A translation look-aside buffer circuit for optimizing the translation of virtual addresses into physical addresses for a graphics address remapping table (GART), the circuit comprising:

a translation look-aside buffer cache comprising a plurality of translation look-aside buffer entries operable to buffer information, wherein an access is made to the translation look-aside buffer cache for translating between a virtual address and a physical address; and a least recently used pointer circuit coupled to the translation look-aside buffer cache, the least recently used pointer circuit comprising a plurality of pointer entries, said least recently used pointer circuit operable to store said plurality of pointer entries, each pointer entry operable to point to a respective translation look-aside buffer entry, the plurality of pointer entries ordered according to a degree of usage of the information buffered in each of the translation look-aside buffer entries, wherein an update is made to the least recently used pointer circuit for the access into translation look-aside buffer cache to reflect said access into said translation look-aside buffer cache, and wherein the update to the least recently used pointer circuit is pipelined with the access into translation look-aside buffer cache.

* * * * *